(12) United States Patent
Syed et al.

(10) Patent No.: US 11,935,590 B2
(45) Date of Patent: Mar. 19, 2024

(54) DEVICE FOR MATRIX-VECTOR MULTIPLICATIONS

(71) Applicant: International Business Machines Corporation, Armonk, NY (US)

(72) Inventors: Ghazi Sarwat Syed, Zurich (CH); Manuel Le Gallo-Bourdeau, Horgen (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 17/706,695

(22) Filed: Mar. 29, 2022

(65) Prior Publication Data

US 2023/0317153 A1 Oct. 5, 2023

(51) Int. Cl.
*G11C 11/00* (2006.01)
*G06F 17/16* (2006.01)
*G11C 13/00* (2006.01)

(52) U.S. Cl.
CPC .......... *G11C 13/0004* (2013.01); *G06F 17/16* (2013.01); *G11C 13/0026* (2013.01); *G11C 13/0028* (2013.01); *G11C 13/0038* (2013.01); *G11C 13/004* (2013.01); *G11C 13/0064* (2013.01); *G11C 13/0069* (2013.01)

(58) Field of Classification Search
CPC .......... G11C 16/10; G11C 16/30; G11C 16/12; G11C 16/0483; G11C 11/16; G11C 11/15; H01L 43/08; H01L 27/15
USPC .................................................. 365/148, 158
See application file for complete search history.

(56) References Cited

U.S. PATENT DOCUMENTS

| | | | |
|---|---|---|---|
| 9,558,820 B2 * | 1/2017 | Perner | G11C 13/0069 |
| 10,957,410 B1 * | 3/2021 | Nazarian | G11C 11/5635 |
| 2016/0247563 A1 | 8/2016 | Perner | |
| 2020/0118624 A1 | 4/2020 | Giannopoulos | |
| 2023/0245698 A1 * | 8/2023 | Dubreuil | G11C 13/0026 |
| | | | 365/148 |

FOREIGN PATENT DOCUMENTS

| | | |
|---|---|---|
| CN | 112215344 A | 1/2021 |
| WO | 2021011923 A1 | 1/2021 |

\* cited by examiner

*Primary Examiner* — Son T Dinh
(74) *Attorney, Agent, or Firm* — Michael O'Keefe (57) ABSTRACT

The invention is notably directed to a device for performing a matrix-vector multiplication of a matrix with a vector. The device comprises a memory crossbar array comprising a plurality of row lines, a plurality of column lines and a plurality of junctions arranged between the plurality of row lines and the plurality of column lines. Each junction comprises a programmable resistive element and an access element for accessing the programmable resistive element. The device further comprises a readout circuit configured to perform read operations by applying positive read voltages of one or more first amplitudes and negative read voltages of one or more second amplitudes corresponding to the one or more first amplitudes. The one or more first amplitudes and the corresponding one or more second amplitudes are different from each other, thereby correcting polarity dependent current asymmetricities.

18 Claims, 6 Drawing Sheets

DEVICE FOR MATRIX-VECTOR MULTIPLICATIONS

BACKGROUND

The present invention relates generally to the field of cognitive computing, and more particularly to, a correction method for reducing imprecision caused by the bias polarity dependent current flow in memristors.

Cognitive computing is a promising technology for deriving intelligence and knowledge from large volumes of data. Today's cognitive computers are usually based on the Von Neumann architecture in which the computing and the memory units are separated. Cognitive computing is inherently data-centric, meaning that huge amounts of data need to be shuttled back and forth at high speeds.

Memcomputing is a key non-Von Neumann approach being researched. A key element in this novel computing paradigm is a high-density, low-power, variable state, programmable and non-volatile memory device. Resistive memories such as RERAM and Phase Change Memory are fast emerging non-volatile memory technologies of computational memory. In computational memory, their physical attributes are exploited for both data storage and computation.

A fundamental computational primitive is a matrix-vector multiplication. This primitive is of particular interest as it forms the basis of several linear algebraic operations, and it is one of the most commonly used mathematical operations in science and engineering. A matrix is usually represented by a two-dimensional array of matrix elements and a vector by a one-dimensional array of vector elements. A matrix may be considered as array of vectors. Hence a matrix-vector multiplication can be generalized to a matrix-matrix multiplication and to a vector-vector multiplication.

SUMMARY

According to an aspect, the invention is embodied as device for performing a matrix-vector multiplication of a matrix with a vector. The device comprises a memory crossbar array comprising a plurality of row lines, a plurality of column lines and a plurality of junctions arranged between the plurality of row lines and the plurality of column lines. Each junction comprises a programmable resistive element and an access element for accessing the programmable resistive element. The device further comprises a readout circuit configured to perform bipolar read operations by applying either positive read voltages of one or more first amplitudes or negative read voltages of one or more second amplitudes. The one or more first amplitudes of the positive read voltages and the corresponding one or more second amplitudes of the negative read voltages are each different from each other, thereby correcting polarity dependent output current asymmetricities.

According to another aspect a design structure is provided. The design structure is tangibly embodied in a machine readable medium for designing, manufacturing, or testing an integrated circuit. The design structure comprises a device according to the previous aspect.

According to another aspect, a method for performing a matrix-vector multiplication of a matrix with a vector by means of a device of the previous aspect is provided. The method comprises steps of obtaining a correction factor for correcting polarity dependent output current asymmetricities of a device and performing read operations by applying either positive read voltages of one or more first amplitudes or negative read voltages of one or more second amplitudes. The one or more first amplitudes of the positive read voltages and the corresponding one or more second amplitudes of the negative read voltages are each different from each other, thereby correcting polarity dependent output current asymmetricities.

Embodiments of the invention will be described in more detail below, by way of illustrative and non-limiting examples, with reference to the accompanying drawings.

DETAILED DESCRIPTION

The present invention relates generally to the field of cognitive computing, and more particularly to, a correction method for reducing imprecision caused by the bias polarity dependent current flow in memristors.

Resistive memories are afflicted with various non-idealities. Accordingly, there is a need for new and improved memcomputing devices, in particular for memcomputing devices that can perform matrix-vector multiplications in an improved manner. Embodiments of the present invention recognize a need for a method to enable large reductions in polarity induced computational error. Embodiments of the present invention can be employed using pre-existing digital circuities in standard crossbars, and do not require new special circuitries. Embodiments of the present invention are compatible across most memory technologies, and crossbar layouts.

Embodiments of the present invention obtain a correction factor by using a set of devices (e.g., 1000-10000) instead of an entire array, for sufficient statistics or can be modelled beforehand off-chip. The correction factor α can be estimated through a variety of approaches, such as a computer model, array-scale hardware, and single-device hardware. In a computer model, if the state-dependent current asymmetry of devices is known, then scalar and MAC operations in memristive arrays can be simulated and through some optimization schemes, a can be computed. In an array-scale hardware model, scalar, and MAC operations in memristive arrays can be experimentally determined for a used chip and through some optimization schemes, a can be computed. In a single-device hardware from state-dependent current asymmetry measurements on single devices, a can be determined using optimization or simply averaging. Other methods may be used to reduce the effect of asymmetry. For example, a certain % of devices in the memristive array can be programmed to a lower or higher conductance state relative to their target. Thus, the current asymmetry can be counterbalanced by the ΔG from programming.

Embodiments of the present invention address output current asymmetry by correcting such a polarity-dependent output current asymmetry in computational memories by using discrete (separate) read voltages for the positive and negative reads. More particularly, such a correction is performed when the input vector to the computational memory has both positive and negative read voltages and the output current in the resistive elements changes with the polarity of the applied READ bias. According to some embodiments of the present invention, the correction is performed by modulating the corresponding amplitude under one polarity relative to the other polarity.

Embodiments of the invention may bring significant power and/or speed advantages compared to the conventional Von-Neumann approach where the data has to be shuttled back and forth between a central processing unit (CPU) and the memory.

In reference to FIGS. 1-11, some general aspects and terms of embodiments of the invention are described.

According to embodiments of the invention, a resistive element may be defined as an element whose electrical resistance can be changed by applying an electrical programming signal to the resistive element. The resistive element may be in particular embodied as resistive memory element. The electrical programming signal may be e.g., a current flowing through the resistive memory element, or an electrical voltage applied to the resistive memory element. The current and/or voltage may be e.g., applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g., a chalcogenide. These resistive memory elements exhibit good performance in terms of power consumption, integration density potential, retention, and endurance.

Embodiments of the invention provide a way to do inexact fast matrix-vector multiplications. The result from this multiplication may preferably be used in algorithms that do not require high precision for multiplication tasks.

As a matrix-vector multiplication can be generalized to a matrix-matrix multiplication and to a vector-vector multiplication, the device, and the methods according to embodiments of the invention can also be used to perform matrix-matrix multiplications and vector-vector multiplications.

Resistive memories are afflicted with various non-idealities, namely READ noise, resistance drift, and thermal fluctuations. Embodiments of the invention address another non-ideality, namely the current's dependency on the polarity of the applied bias for a READ operation.

Investigations of the applicant have shown that such a non-ideality emerges in particular for computational memory applications. More particularly, in applications, such as in artificial neural networks and scientific computing, computational memory performs scalar and matrix-vector multiplication (MAC) operations using Ohm's and Kirchhoff's current summations laws, respectively. If there are negative numbers or if a transpose matrix operation is to be performed, the READ polarity that the resistive elements see reverses. Accordingly, a current or in other words output current asymmetry may lead to erroneous results.

Figure 1:
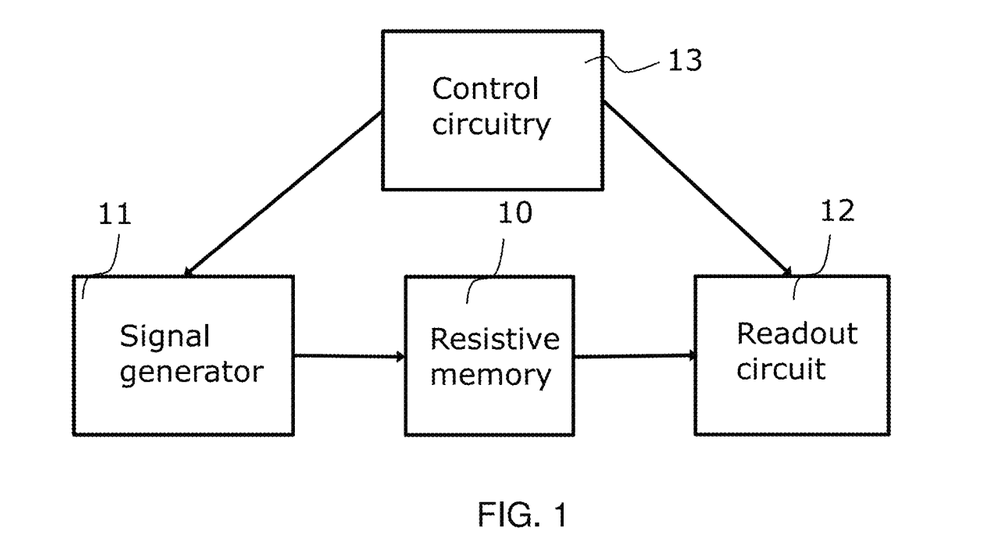
FIG. 1 is a simplified schematic block diagram of a device for performing a multiplication of a matrix with a vector according to an embodiment of the invention.

FIG. 1 is a simplified schematic block diagram of a device 100 for performing a multiplication of a matrix with a vector using pulse width or pulse amplitude read schemes. The device 100 comprises a resistive memory 10 having a plurality of programmable resistive elements. Furthermore, a signal generator 11 is provided. The signal generator 11 is configured to apply electrical programming signals to the resistive elements of the resistive memory 10. The signal generator 11 comprises circuitry for programming the resistive memory cells during data write or programming operations such that a multiplication of a matrix with a vector can be performed. The row lines and column lines may also be denoted as word and bit lines. The signal generator 11 is configured to receive a matrix A as input and to apply programming signals to the resistive elements to program conductance values of the resistive elements for a matrix-vector multiplication. The conductance values represent matrix values of the matrix that shall be multiplied with the vector.

In addition, the device 100 comprises a readout circuit 12 configured to read out resistance values of the resistive elements during data read operations. The device 100 is configured to apply read out voltages to the rows of the memory crossbar array. The read out voltages represent vector elements of the vector that shall be multiplied with the matrix. The device is further configured to read out current values of columns of the memory array. The current values represent result values of vector elements of a result vector of the multiplication.

The device 100 further comprises control circuitry 13 configured to control the signal generator 11 and the readout circuit 12.

The resistive memory 10 may be generally any kind of resistive memory as described above. In particular it may be a phase change memory (PCM) or a resistive random access memory (RRAM). In the following it assumed that the resistive memory 10 is embodied as PCM. Accordingly, the resistive memory 10 comprises a plurality of PCM cells as resistive memory elements. The PCM cells of memory 10 may comprise s=2 or s>2 programmable resistance states, the latter providing multilevel operation. The s programmable resistance-states correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the crystalline phase within the otherwise amorphous PCM material. The s programmable cell-states are typically defined in terms of predetermined reference values, or ranges of values, of the resistance metric used for read detection by the readout circuit 12.

To perform a matrix-vector multiplication, the PCM cells are programmed according to embodiments in a kind of write operation. More particularly, the signal generator 11 applies a voltage to the cell via the column lines and row lines such that the resulting programming signal sets the cell to a state (conductance value) that represents a matrix element of the matrix that shall be multiplied with the vector. In a read operation, (lower) read voltages are applied to the column lines or row lines. Then the resulting output current values of the row lines or column lines are read/measured to obtain the result vector.

Figure 2:
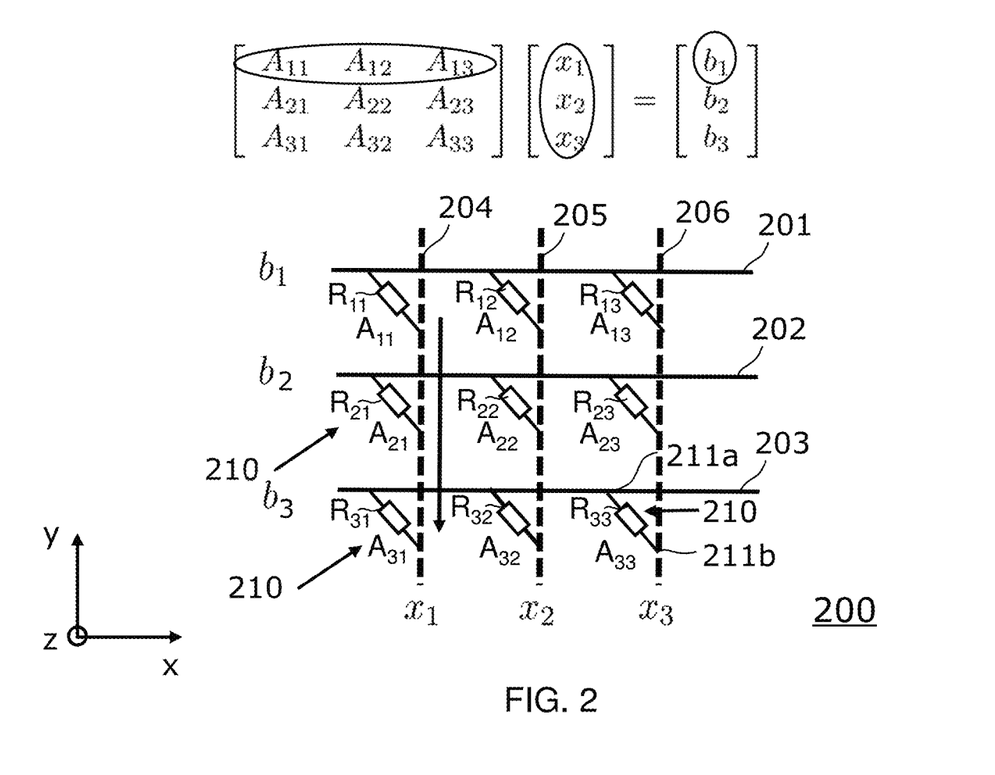
FIG. 2 illustrates an example of matrix-vector multiplication according to an embodiment of the invention.

FIG. 2 illustrates an example of a matrix multiplication according to an embodiment of the invention. The matrix multiplication uses Ohm's law and Kirchhoff's law in a resistive memory crossbar array.

According to the illustrated example, a matrix A of size 3×3 shall be multiplied with a vector x and the result is a product or result vector b, below:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}$$

Accordingly, the matrix A comprises a first column consisting of the matrix elements $A_{11}$, $A_{21}$ and $A_{31}$, a second column consisting of the matrix elements $A_{12}$, $A_{22}$ and $A_{32}$ and a third column consisting of the matrix elements $A_{13}$, $A_{23}$ and $A_{33}$. The vector x comprises the vector elements $x_1$, $x_2$ and $x_3$.

For such a multiplication of the matrix A with the size 3×3, the resistive memory 10 comprises a memory crossbar array 200 of a corresponding size 3×3.

The memory crossbar array 200 comprises 3 row lines 201, 202 and 203 and three column lines 204, 205 and 206. The three row lines 201, 202 and 203 are arranged above the three column lines 204, 205 and 206 which is indicated by dotted lines. More particularly, the row lines 201, 202 and 203 extend in a first x-y-plane and the three column lines extend in a second x-y plane, wherein the first x-y plane is arranged in the vertical z-direction above the second x-y-plane.

The three row lines 201, 202 and 203 and the three column lines 204, 205 and 206 are connected to each other via vertical junctions 210. The junctions 210 extend in the vertical z-direction between upper cross points 211a of the row lines 201-203 and lower cross points 211b of the column lines 204-206.

Each junction 210 comprises a serial arrangement of a resistive memory element and a transistor. For ease of illustration, the transistors are not shown in FIG. 2.

More particularly, the crossbar array 200 comprises 9 resistive memory elements embodied as PCM cells. The row line 201 comprises resistive memory elements $R_{11}$, $R_{12}$ and $R_{13}$, the row line 202 comprises the memory elements $R_{21}$, $R_{22}$ and $R_{23}$ and the row line 203 the memory elements $R_{31}$, $R_{32}$ and $R_{33}$.

In order to perform the matrix vector multiplication of the above matrix, the signal generator 11 applies programming signals, in particular current pulses, to the resistive memory elements and thereby programs the conductance values for the matrix-vector multiplication.

More particularly, the conductance values of the resistive memory elements represent matrix values of the matrix of the matrix-vector multiplication. Accordingly, the conductance of the resistive memory element $R_{11}$ is programmed to the matrix value $A_{11}$, the conductance of the resistive memory element Ru is programmed to the matrix value $A_{12}$, or more generally the conductance of the resistive memory Rij is programmed to a corresponding matrix value Aij.

Then the readout circuit 12 applies read voltages to the column lines 204, 205 and 206. More particularly, the readout circuit 12 applies a read voltage $X_1$ to the column line 204, a read voltage $X_2$ to the column line 205 and a read voltage $X_3$ to the column line 206. Hence the read voltages represent vector values of the vector of the matrix-vector multiplication.

Furthermore, the readout circuit 12 reads out current values of the row lines 201, 202 and 203. As an example, the readout circuit 12 reads out a current value $b_1$ from the row line 201, which is the sum of three multiplications, namely $$b_1 = A_{11}x_1 + A_{12}x_2 + A_{13}x_3.$$

Accordingly, the readout circuit 12 reads out a current value $b_2$ from the row line 202 and a current value $b_3$ from the row line 203. The current values represent the result values of the vector elements of the product vector b.

In a corresponding manner the readout circuit 12 may apply read voltages to the row lines 201, 202 and 203 and read out current values of the column lines 204, 205 and 206 to perform a transpose matrix-vector multiplication.

Figure 3:
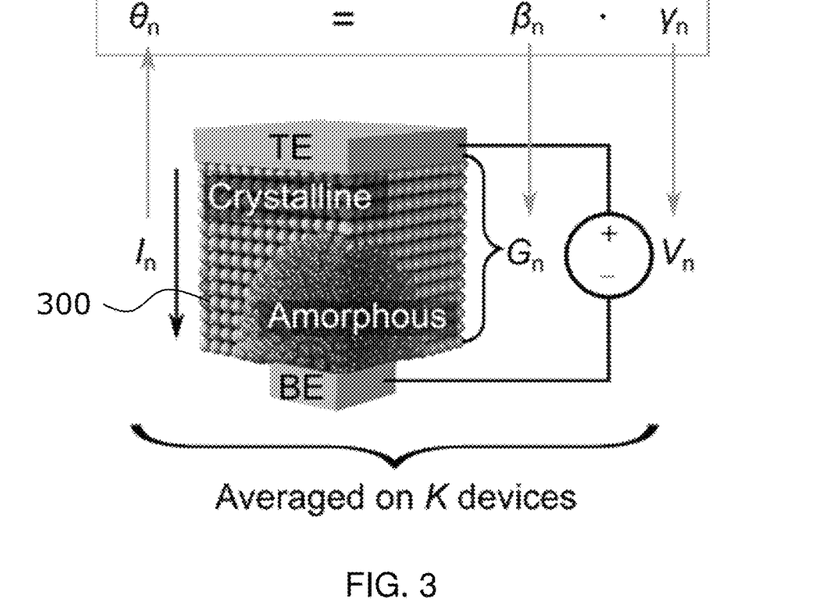
FIG. 3 illustrates an exemplary embodiment of a scalar multiplication to be performed by a phase change memory cell.

FIG. 3 illustrates an exemplary embodiment of a scalar multiplication that may be performed by a PCM cell 300. Such a scalar multiplication forms the basis of the matrix-vector multiplication performed according to embodiments of the invention. Let $$\theta_n = \beta_n \cdot \gamma_n$$

where $\beta_n$ and $\gamma_n$ are numbers generated uniformly in [0,1]. $\beta_n$ is mapped to an effective conductance $G_n$, and $\gamma_n$ to a voltage $V_n$. As the current in the PCM cell 300 is a slightly non-linear function of the voltage, the analogue scalar multiplication may be expressed to follow a "pseudo" OHM's law, namely by $$I_n \cong \alpha G_n \cdot f(V_n)$$

In the equation, $\alpha$ is a time dependent conductance variation parameter and f a function, in particular a polynomial function that approximates the current-voltage characteristics of the PCM cell 300. The PCM cell 300 may be programmed to the effective conductance $G_n$ by an iterative program and verify procedure. Then the readout circuit 12 may apply a read voltage $V_n$ and readout the current $I_n$. Finally, the current $I_n$ is converted back to approximate the value $\theta_n$, representing the result of the scalar multiplication. According to preferred embodiments, an averaging of the result over K memory elements/PCM cells is performed.

Figure 4:
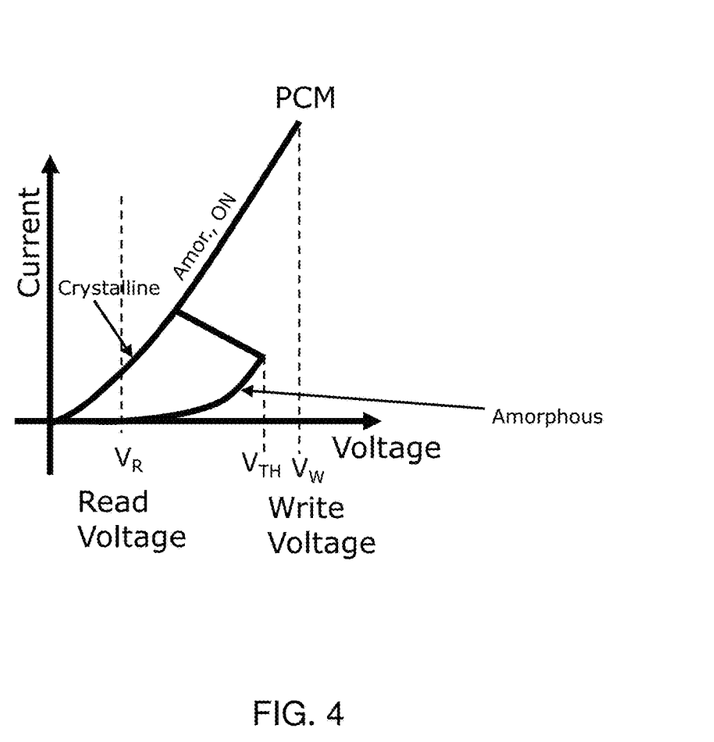
FIG. 4 is a schematic illustration of the current/voltage characteristics of the material components of the phase change memory cell of FIG. 3.

FIG. 4 is a schematic illustration of the current/voltage (and hence resistance) characteristics of the material components of the memory cell 300 of FIG. 3. The solid lines indicate variation of current with voltage for the PCM material, starting from the fully-crystalline SET state (upper curve) and also the fully-amorphous RESET state (lower curve). These two curves reflect the large (typically 3 orders of magnitude) variation in resistivity between the crystalline and amorphous phases. The amorphous phase exhibits a non-linear characteristic with a threshold switching phenomenon that is field induced. At a certain threshold voltage VTH, this phase switches to a very low "ON-state" resistance corresponding to that of the crystalline PCM material. The cell programming (write) voltage is selected to be above this threshold voltage as indicated.

As can be seen in FIG. 4, the current in the read mode is a slightly non-linear function of the voltage.

Figure 5:
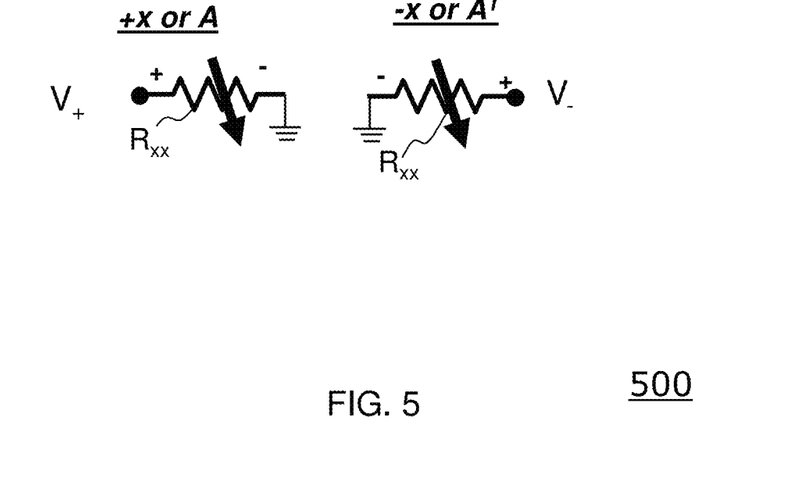
FIG. 5 shows an exemplary resistive element which can see a positive voltage and a negative voltage.

Referring again to FIG. 2, the matrix A may be transposed or non-transposed. Likewise, the vector elements $x_1$, $x_2$ and $x_3$ of the vector X may be each positive or negative. In applications, such as in artificial neural networks and scientific computing, devices according to embodiments of the invention may perform scalar and matrix-vector multiplications (MAC) operations using Ohm's and Kirchhoff's current summations laws, respectively. If there are negative numbers or if a transpose matrix operation is to be performed, the READ polarity that the resistive elements see reverses. This is shown in FIG. 5 for an exemplary resistive element $R_{xx}$ which can see a positive voltage $V_+$ and a negative voltage $V_-$, generally designated 500.

Figure 6:
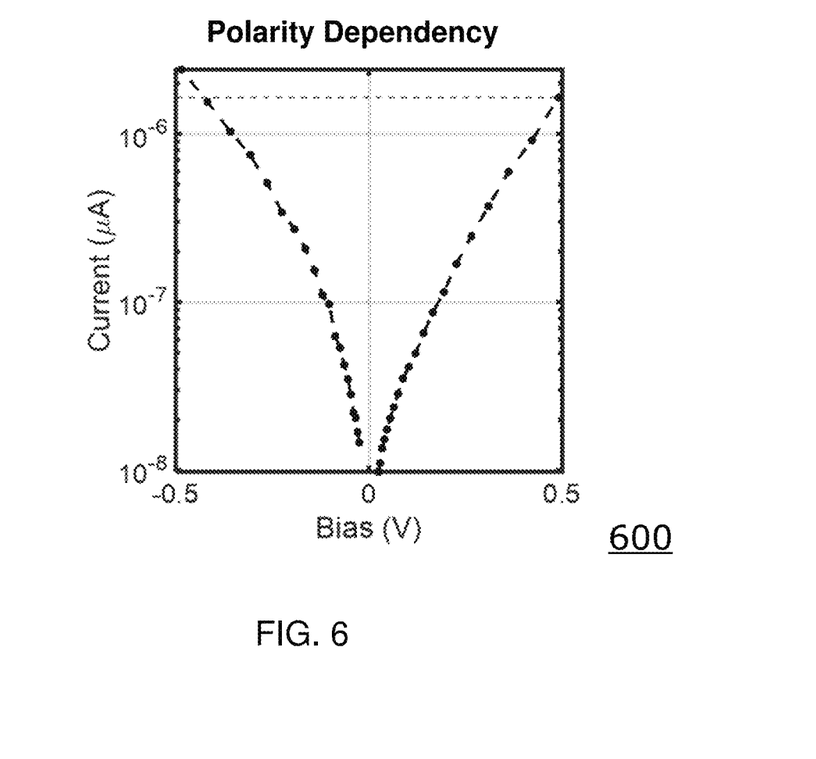
FIG. 6 illustrates exemplary measurement results of a resistance change of resistive elements in dependence on the polarity of the applied voltage.

FIG. 6 illustrates exemplary measurement results of a resistance change of resistive elements in dependence on the voltage polarity of the input, generally designated 600. The horizontal x-axis denotes the applied read voltage in V and the vertical y-axis the resulting read current or output current in µA. As can be seen in FIG. 6, there is an output current asymmetry in dependence on the polarity of the applied voltage. This may result in computational errors of the respective computation.

Embodiments of the invention address this output current asymmetry by correcting such a polarity-dependent output current asymmetry in computational memories by using discrete (separate) read voltages for the positive and negative reads. More particularly, such a correction is performed when the input vector to the computational memory has both positive and negative read voltages and the output current in the resistive elements changes with the polarity of the applied READ bias. According to embodiments, the correction is performed by modulating the corresponding amplitude under one polarity relative to the other polarity. Throughout the specification output current may just be denoted as current.

More particularly, embodiments of the invention provide a readout circuit, e.g., the readout circuit 12 as shown in FIG. 1, which is configured to apply positive read voltages of one or more first amplitudes and negative read voltages of one or more second amplitudes corresponding to the one or more first amplitudes. Furthermore, the one or more first amplitudes and the corresponding one or more second amplitudes are different from each other, thereby correcting polarity dependent current asymmetricities.

According to some embodiments, the readout circuit is configured to apply one fixed positive amplitude as first amplitude and one fixed negative amplitude as second amplitude.

According to such an embodiment with fixed amplitudes, the information of the positive and the negative read voltages may be encoded as a sequence of bipolar voltage pulses of the fixed first and second amplitudes.

According to another embodiment with fixed amplitudes, the information of the positive and the negative read voltages may be encoded as a duration of bipolar voltage pulses of the fixed first and second amplitudes.

According to embodiments, the fixed first amplitude and the fixed second amplitude may differ from each other by a correction factor.

In other words, the relationship between a positive voltage amplitude $V_+$ as fixed first amplitude and the corresponding negative voltage amplitude $V_-$ as fixed second amplitude may be derived as follows:

$V_- = \alpha \times V_+$, where $\alpha$ is the correction factor.

According to another embodiment, the information of the positive and the negative read voltages may be encoded as a voltage level of bipolar voltage pulses. Hence according to such an embodiment there may be a plurality of first amplitudes having a positive polarity and a plurality of second amplitudes having a negative polarity. The different voltages levels of the plurality of first amplitudes and the corresponding plurality of second amplitudes establish pairs and each the voltage levels of the respective pairs are different from each other. According to embodiments, the voltage levels of the respective pairs may differ from each other by a correction factor.

According to embodiments, the correction factor may be obtained by a variety of different means which will be explained in more details further below.

Figure 7:
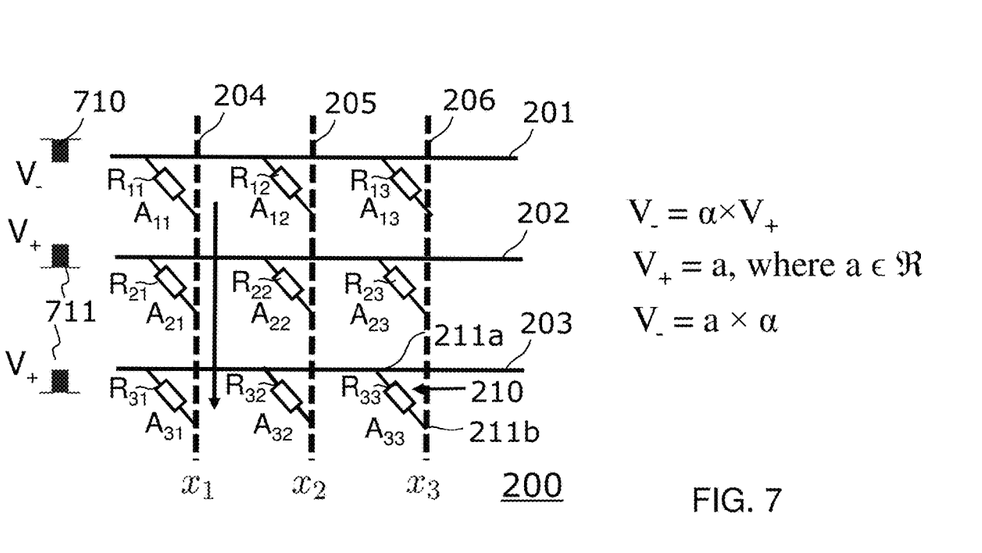
FIG. 7 illustrates an implementation of a method for correcting polarity dependent current asymmetries on the crossbar array of FIG. 2.

Referring now to FIG. 7, an implementation of such a scheme is explained. FIG. 7 shows the crossbar array 200 of FIG. 2. The row line 201 receives a negative read voltage, more particularly a negative read pulse 710 having a first negative amplitude $V_-$. The row lines 202 and 203 receive a positive read voltage, more particularly a positive read pulse 711 having a second positive amplitude $V_+$.

The positive amplitude $V_+$ may correspond to a voltage value a, where $a \in \mathfrak{R}$. The negative amplitude $V_-$ may then be computed as $V_- = \alpha \times V_+$, wherein $\alpha$ is the correction factor. In dependence on the respective characteristics of the resistive devices, the correction factor $\alpha$ may be greater than or smaller than 1. More particularly, $\alpha < 1$ if the read current $I_-$ for negative voltage pulses is greater than the read current $I_+$ for positive voltage pulses ($I_- > I_+$). On the other hand, the correction factor $\alpha > 1$ if the read current L for negative voltage pulses is smaller than the read current $I_+$ for positive voltage pulses ($I_- < I_+$).

Such a scheme may enable large reductions in polarity induced computational errors. The implementation of the correction factor may be employed by adding additional functionality to pre-existing digital circuitries, e.g., to the readout circuit 12. Hence embodiments of the invention can be implemented efficiently into existing hardware of computational memories. Since embodiments of the invention are based on a software scheme, embodiments of the invention are compatible across most memory technologies and crossbar layouts.

In machine learning such as in convolutional neural networks, the inputs to the computational memory may take arbitrary number of positive and negative reads.

Figure 8:
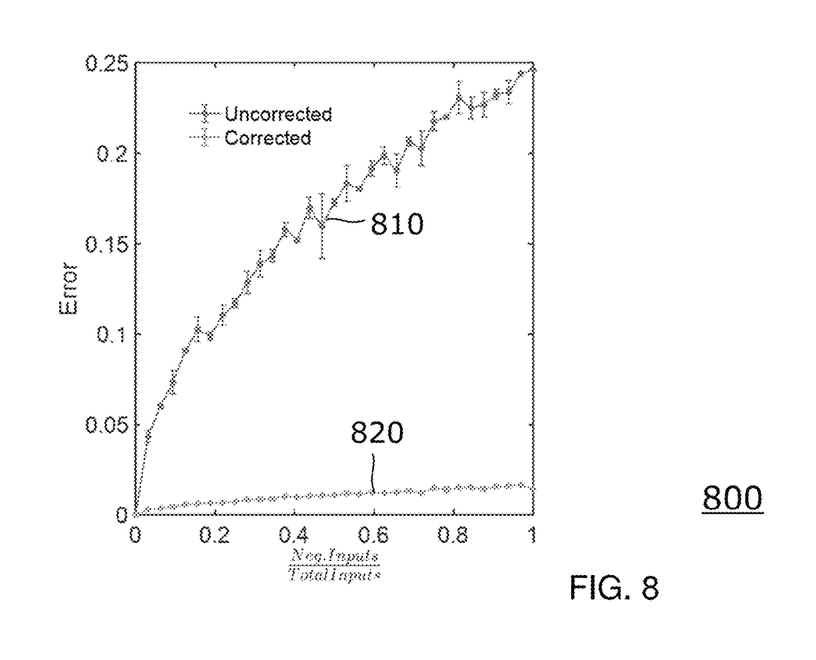
FIG. 8 illustrates the effect of the input distribution between negative and positive read voltages on a corresponding computational error with and without the implementation of a method for correcting polarity dependent current asymmetries.

FIG. 8 illustrates the effect of the input distribution on the corresponding error. More particularly, the vertical y-axis denotes the error and the horizontal x-axis the relation between negative and positive read voltages. FIG. 8 shows experimental results for a crossbar with 256 column lines and 256 row lines with Gaussian distributed weights around a mean of 0 µS, generally designated 800. The curve 810 shows the error without a correction of the polarity dependent current asymmetricities, while curve 820 shows the error with a correction of the polarity dependent current asymmetricities. As can be seen in FIG. 8, when the number of negative reads increases, the error increases as well.

Furthermore, the correction scheme according to embodiments of the invention reduces the overall error and the corrected error scales less dramatically when the number of negative reads increases.

Figure 9:
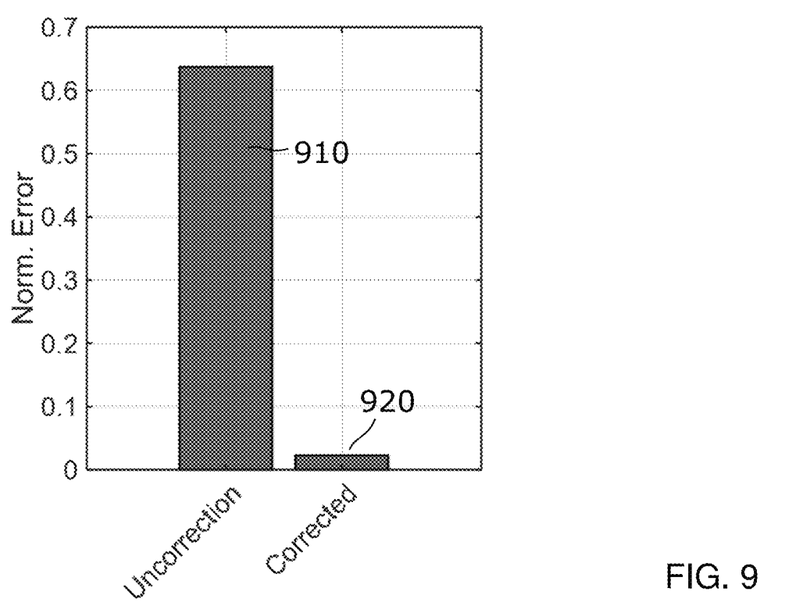
FIG. 9 illustrates the overall nominal error of a matrix vector multiplication with and without the implementation of a method for correcting polarity dependent current asymmetries.

FIG. 9 illustrates the overall nominal error of a matrix vector multiplication. The bar 910 shows the uncorrected error, while the bar 920 shows the corrected error. More particularly, the correction factor that has been used for the diagram of FIG. 9 has been estimated or in other words obtained as follows:

At a first step, a memory crossbar array is provided.

Then, a plurality of matrix-vector multiplications are performed with positive read voltages, e.g., with read voltage pulses having a positive amplitude of 200 mV. The total current $I_{total}$ of the column lines is measured.

At a subsequent step, a plurality of matrix-vector multiplications are performed with negative read voltages, e.g., with read voltage pulses having a negative amplitude of −200 mV, wherein the asymmetry remains included. Again, a total current $I'_{total}$ in the column lines is measured.

Next, the mean square error ($I_{total} - I'_{total}$, is) determined.

Finally, an optimization scheme algorithm may be run to find the optimal negative read voltage amplitude that results in the minimal error. As a result of the optimization, a correction factor $\alpha = V_+/V_-$ may be computed. The optimization scheme may be in particular a linear regression.

Generally, the correction factor $\alpha$ may be determined by measurements or by simulation. The measurements may be performed on single resistive elements, on a set of resistive elements (e.g., 1000-10000 resistive elements) or on an entire memory crossbar array or chip. More particularly, according to an embodiment, the step of obtaining the correction factor comprises performing a plurality of operations such as one or more matrix-vector multiplications on the memory crossbar array and measure the corresponding state-dependent current asymmetry. Then the correction factor may be computed/determined, e.g., by means of a predefined optimization scheme such a linear regression.

According to a further embodiment, the step of obtaining the correction factor may comprise performing a plurality of state dependent current measurements on a single resistive element and compute the correction factor by means of a predefined optimization scheme or just by performing an averaging of the plurality of measurements.

In case of a determination of the correction factor by simulation, the step of obtaining the correction factor may comprise providing a model of a state-dependent current asymmetry of the resistive elements. This model then serves as basis for a simulation of operations in the memory crossbar array. Based on the results of the simulation the correction factor may be computed by means of a predefined optimization scheme such as linear regression.

According to a further embodiment, a predefined first percentage of the plurality of resistive elements may be programmed to a first conductance state and a predefined second percentage of the plurality of resistive elements may be programmed to a second conductance state which is different from the first conductance state. Such an embodiment may be used to counterbalance the polarity dependent current asymmetry. Such an embodiment may be used in particular in combination with the above described application of a polarity dependent correction factor, but also independently.

In an embodiment, the resistive elements are one of Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements, and a system device, comprising transistors, resistors, capacitors, and/or inductors, jointly emulating a behavior of a resistive memory element.

Figure 10:
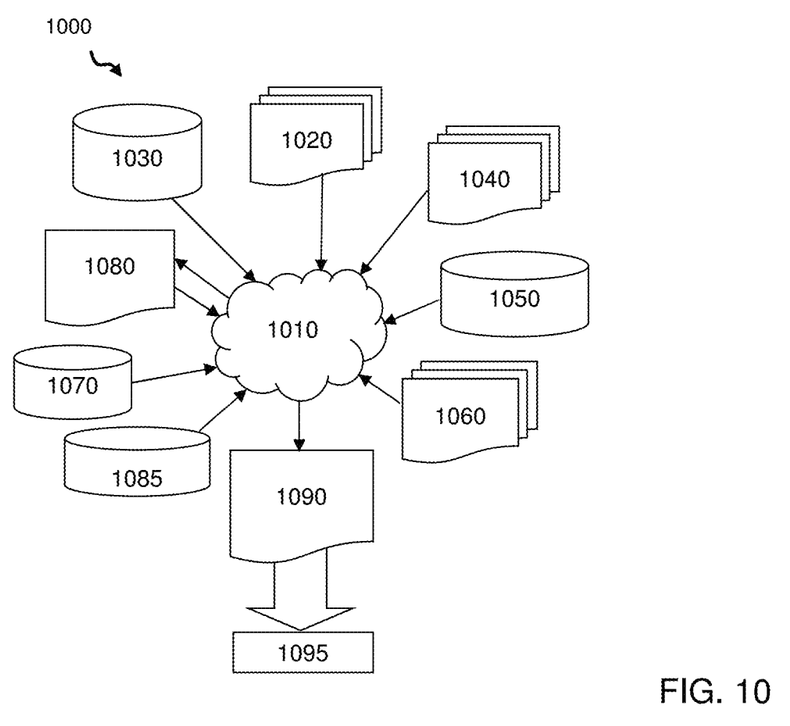
FIG. 10 shows a block diagram of an exemplary design flow.

FIG. 10 shows a block diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above and shown e.g., in FIGS. 1-5. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA).

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 1-5. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 1-5 to generate a Netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including Netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 1090 may comprise a compiled, executable HDL simulation model that functionally simulates the devices shown in FIGS. 1-5. Design structure 1090 may also employ a data format used for the exchange of layout data of integrated circuits and/or symbolic data format (e.g., information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 1090 may then proceed to a stage 1095 where, for example, design structure 1090: proceeds to tape-out, is released to manufacturing, is released to a mask house, is sent to another design house, is sent back to the customer, etc.

Figure 11:
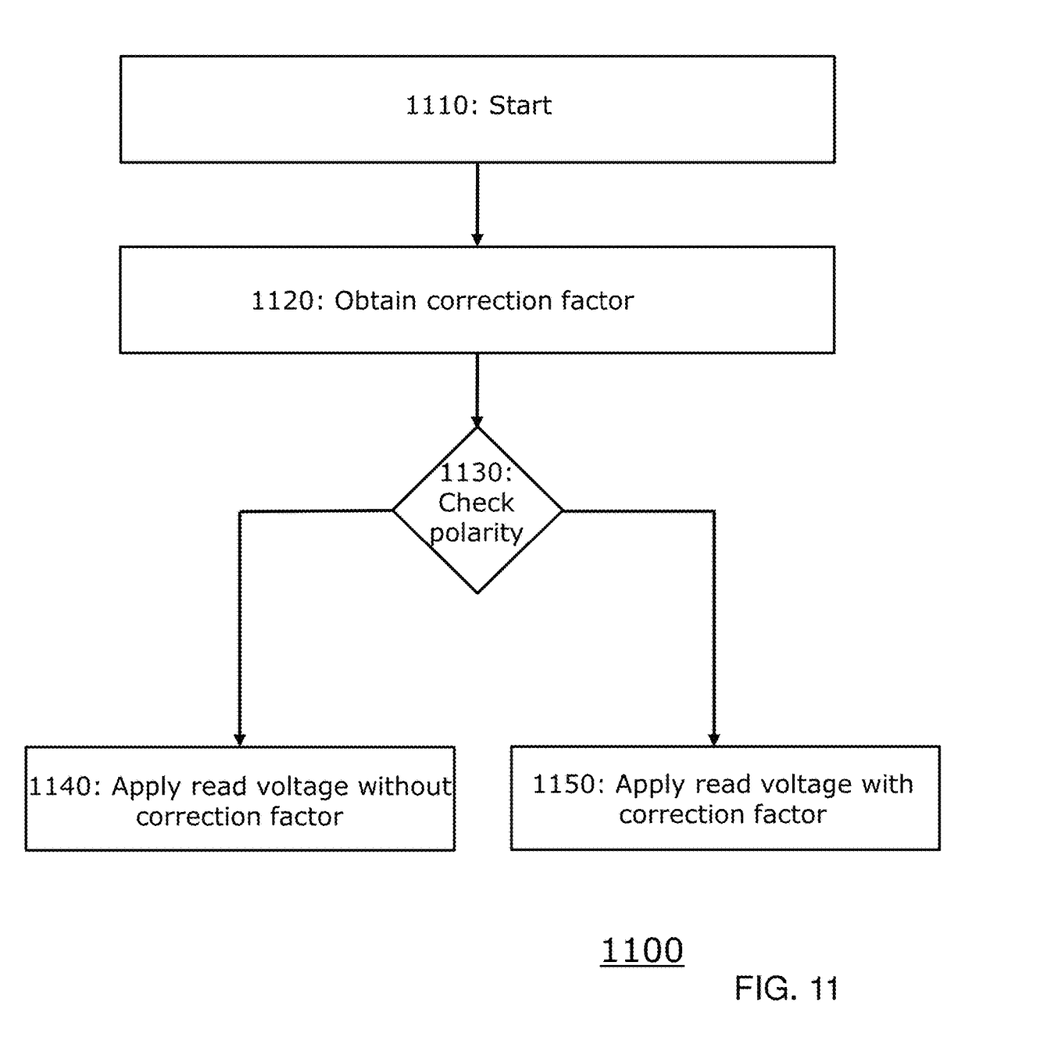
FIG. 11 shows a flow chart of method steps of a method for correcting polarity dependent current asymmetries.

FIG. 11 shows a flow chart of method steps of a method for correcting polarity dependent current asymmetricities of a device for performing a matrix-vector multiplication of a matrix with a vector, generally designated 1100. The method may be performed e.g., by means of the memory crossbar array 200 of FIG. 2.

The method starts at a step 1110.

At a step 1120, a correction factor is obtained, e.g., with one of the methods as described above.

At a step 1130, the read circuitry, e.g., the read circuitry 12, checks whether the read voltage to be applied is positive or negative. If the read voltage to be applied is positive, it is applied at a step 1140 without a correction factor. If the read voltage to be applied is negative, it is applied at a step 1150 with a correction factor.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A memory circuit for performing a matrix-vector multiplication of a matrix with a vector,
the memory circuit comprising:
a memory crossbar array comprising:
a plurality of row lines;
a plurality of column lines; and
a plurality of junctions arranged between the plurality of row lines and the plurality
of column lines, wherein each junction comprises a programmable resistive element and
an access element for accessing the programmable resistive element; and
a readout circuit configured for performing bipolar read operations by applying either positive read voltages of one or more first amplitudes or negative read voltages of one or more second amplitudes, wherein the one or more first amplitudes of the positive read voltages and the corresponding one or more second amplitudes of the negative read voltages are each different from each other by a correction factor, thereby correcting polarity dependent output current asymmetricities.

2. The memory circuit of claim 1, wherein the information of the positive and the negative read voltages is encoded as a sequence of bipolar voltage pulses of a fixed first and a fixed second amplitude.

3. The memory circuit of claim 1, wherein the information of the positive and the negative read voltages is encoded as a duration of bipolar voltage pulses of a fixed first and a fixed second amplitude.

4. The memory circuit of claim 3, wherein the information of the positive and the negative read voltages is encoded as a voltage level of bipolar voltage pulses.

5. The memory circuit of claim 1, wherein:
conductance values of the plurality of resistive elements represent matrix values of the matrix of the matrix-vector multiplication;
the positive and negative read voltages represent vector values of the vector of the matrix-vector multiplication; and
the current values of the plurality of columns represent result values of vector elements of a product vector of the matrix-vector multiplication.

6. The memory circuit of claim 1, wherein the access elements are embodied as transistors.

7. The memory circuit of claim 1, wherein the resistive elements are one of Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements, and a system device, comprising transistors, resistors, capacitors, and/or inductors, jointly emulating a behavior of a resistive memory element.

8. The memory circuit of claim 1, wherein a predefined first percentage of the plurality of resistive elements is programmed to a first conductance state and a predefined second percentage of the plurality of resistive elements is programmed to a second conductance state, wherein the first and the second conductance state are different from each other, thereby counterbalancing a polarity dependent output current asymmetry.

9. The memory circuit of claim 1, further comprising a signal generator, the signal generator being configured to program the conductance values of the resistive elements by an iterative program and verify procedure.

10. The memory circuit of claim 1, wherein the memory circuit is tangibly embodied in a machine readable medium for designing, manufacturing, or testing an integrated circuit.

11. An apparatus for an memristor crossbar array, the apparatus comprising:

a readout circuit configured for performing bipolar read operations by applying either positive read voltages of one or more first amplitudes or negative read voltages of one or more second amplitudes, wherein the one or more first amplitudes of the positive read voltages and the corresponding one or more second amplitudes of the negative read voltages are each different from each other by a correction factor, thereby correcting polarity dependent output current asymmetricities of the memristor crossbar array.

12. The apparatus of claim 11, wherein the information of the positive and the negative read voltages is encoded as a duration of bipolar voltage pulses of a fixed first and a fixed second amplitude.

13. A computer-implemented method for correcting polarity dependent current asymmetricities of a memristor crossbar array the computer-implemented method comprising:
obtaining a correction factor for correcting polarity dependent output current asymmetricities of the memristor crossbar array; and
performing read operations by applying either positive read voltages of one or more first amplitudes or negative read voltages of one or more second amplitudes, wherein the one or more first amplitudes of the positive read voltages and the corresponding one or more second amplitudes of the negative read voltages are each different from each other, thereby correcting polarity dependent output current asymmetricities.

14. The computer-implemented method of claim 13, wherein obtaining the correction factor comprises determining the correction factor by simulation.

15. The computer-implemented method of claim 14, wherein obtaining the correction factor further comprises:
providing a model of a state-dependent current asymmetry of a plurality of resistive elements of the memristor crossbar array;
simulating operations in the memristor crossbar array; and
computing the correction factor by means of a predefined optimization scheme.

16. The computer-implemented method of claim 13, wherein obtaining the correction factor further comprises determining the correction factor by measurements.

17. The computer-implemented method of claim 16, wherein obtaining the correction factor further comprises:
performing a plurality of operations on the memristor crossbar array;
measuring a state-dependent current asymmetry; and
computing the correction factor by means of a predefined optimization scheme.

18. The computer-implemented method according to claim 16, wherein obtaining the correction factor further comprises:
performing a plurality of state dependent output current measurements on a single resistive element of the memristor crossbar array; and
computing the correction factor by means of a predefined optimization scheme or by performing an averaging.

* * * * *